US012686939B2

(12) United States Patent
Oshima et al.

(10) Patent No.:     US 12,686,939 B2
(45) Date of Patent:       Jul. 21, 2026

(54) METHOD FOR PRODUCING SINGLE CRYSTAL DIAMOND AND SINGLE CRYSTAL DIAMOND

(71) Applicants: DISCO Corporation, Tokyo (JP); Ioffe Institute, St Petersburg (RU)

(72) Inventors: Ryuji Oshima, Tokyo (JP); Kanji Iizuka, Saitama (JP); Fedor Shakhov, St Petersburg (RU); Alexander Vul, St Petersburg (RU)

(73) Assignees: DISCO Corporation, Tokyo (JP); Ioffe Institute, St Petersburg (RU)

( * ) Notice: Subject to any disclaimer, the term of this patent is extended or adjusted under 35 U.S.C. 154(b) by 266 days.

(21) Appl. No.: 18/574,213

(22) PCT Filed: Apr. 28, 2022

(86) PCT No.: PCT/JP2022/019412

§ 371 (c)(1),
(2) Date: Dec. 26, 2023

(87) PCT Pub. No.: WO2023/276443

PCT Pub. Date: Jan. 5, 2023

(65) Prior Publication Data

US 2024/0318348 A1      Sep. 26, 2024

(30) Foreign Application Priority Data

Jun. 28, 2021    (JP) ................................. 2021-106509

(51) Int. Cl.
*C30B 1/12*             (2006.01)
*C30B 29/04*         (2006.01)

(52) U.S. Cl.
CPC ................ *C30B 1/12* (2013.01); *C30B 29/04* (2013.01)

(58) Field of Classification Search
CPC ......... B01J 2203/0655; B01J 2203/068; B01J 3/06; B01J 3/062; C30B 1/023; C30B 1/12; C30B 29/04
See application file for complete search history.

(56) References Cited

U.S. PATENT DOCUMENTS 11,427,475 B2     8/2022   Ikeda et al.

FOREIGN PATENT DOCUMENTS

| CN | 1763267 A | 4/2006 |
| JP | 200479980 A | 3/2004 |
| JP | 201140427 A | 2/2011 |
(Continued)

OTHER PUBLICATIONS

English computer translation of WO-2015038031-A1 (Year: 2026).*
(Continued)

*Primary Examiner* — Matthew J Song
(74) *Attorney, Agent, or Firm* — The Webb Law Firm

(57)            ABSTRACT

Provided are a method for producing a single crystal diamond capable of synthesizing a single crystal diamond having excellent durability at a low cost in a short time, and the single crystal diamond. The method for producing the single crystal diamond employs a high-temperature and high-pressure method, and the single crystal diamond is synthesized by exposing raw materials composed of amorphous carbon and a carbon compound to a pressure and a temperature in a thermodynamically stable region of the diamond in a carbon phase equilibrium diagram.

6 Claims, 6 Drawing Sheets

(56)      References Cited

FOREIGN PATENT DOCUMENTS

| | | | | |
|---|---|---|---|---|
| JP | 2013202446 | A | 10/2013 | |
| JP | 201731056 | A | 2/2017 | |
| RU | 2628617 | C2 * | 8/2017 | .............. B01J 3/062 |
| WO | WO-2015038031 | A1 * | 3/2015 | ............. C30B 29/60 |
| WO | 2018101347 | A1 | 6/2018 | |
| WO | WO-2021197471 | A1 * | 10/2021 | ............. C01B 32/26 |

OTHER PUBLICATIONS

English computer translation of WO-2021197471-A1 (Year: 2026).*
English computer translation of RU-2628617-C2 (Year: 2026).*
Kakutani, "Synthesis of high-quality large single-crystal diamond using ultra-high pressure", Applied Physics, 2016, p. 585-589, vol. 85, issue 7.
Shakhov et al., "Boron doped diamond systhesized from detonation nanodiamond in a C—O—H fluid at high pressure and high temperature", Journal of Solid State Chemistry, Dec. 2017, p. 79-92, vol. 256.

* cited by examiner (a)

(b)

SINGLE CRYSTAL
DIAMOND
PARTICLE (b)

SAMPLE (a)

(a)

(b)

(c)

CRYSTAL
NUCLEUS

CRYSTAL
DEFECT (a)    (b)

CRYSTAL
INTERFACE

METHOD FOR PRODUCING SINGLE CRYSTAL DIAMOND AND SINGLE CRYSTAL DIAMOND

CROSS-REFERENCE TO RELATED APPLICATIONS

This application is the United States national phase of International Application No. PCT/JP2022/019412 filed Apr. 28, 2022, and claims priority to Japanese Patent Application No. 2021-106509 filed Jun. 28, 2021, the disclosures of which are hereby incorporated by reference in their entireties.

BACKGROUND

Field

The present invention relates to a method for producing a single crystal diamond and a single crystal diamond.

Description of Related Art

Diamond particles used for industrial purposes are generally synthesized by a high-temperature and high-pressure method. The raw materials used in the synthesis are generally graphite and a molten (also referred to as catalyst, solvent or flux) metal (or alloy and carbide thereof). For example, Patent Document 1 describes a single crystal diamond which is synthesized at a higher concentration of $^{12}C$ to lower an impurity concentration and exclude Ni from the unavoidable impurity. The document discloses that the single crystal diamond shows high hardness due to the low impurity concentration and temperature dependence of the hardness is improved because Ni is not contained in the impurities. The synthesis of this single crystal diamond is carried out based on melt precipitation theory whereby diamond particles are formed in the presence of a molten metal.

On the other hand, a technique for synthesizing diamond particles in a solid state without using a metal catalyst has been studied. For example, Patent Document 2 discloses a method for producing diamond particles, comprising impregnating nanodiamond powder (Detonation Nano Diamond, hereinafter simply referred to as "DND") obtained by a detonation synthesis with a saturated acyclic hydrocarbon or a monobasic alcohol and retaining the obtained composition at a static pressure of 5 to 8 GPa and a temperature of 1300 to 1800° C. for 10 to 60 seconds. As described above, a technique that does not necessarily require a molten metal has been proposed in recent years for the synthesis of diamond particles by the high-temperature and high-pressure method.

CITATION LIST

Patent Document

Patent Document 2
Japanese Unexamined Patent Application Publication No. 2013-202446
Patent Document 2
International Publication No. WO2015/038031
Patent Document 3
International Publication No. WO2018/101347

SUMMARY

Diamond needs a step of synthesizing it by a high-temperature and high-pressure method by using a carbon material obtained by thermally decomposing high-purity hydrocarbon gas as a carbon source, cutting out seed crystals from the synthesized diamond, and growing a single crystal diamond by the high-temperature and high-pressure method by using a raw material, which composes the cut out seed crystals and a metal solvent not containing Ni. However, in the invention described in Patent Document 1, the high-temperature and high-pressure method is carried out twice, and it is necessary to extract and cut out a region where high-quality seed crystals exist, which renders it difficult to reduce a price of the produced diamond.

Moreover, Patent Document 1 discloses that an Fe—Co—Ti alloy is used as a metal catalyst which is a raw material for synthesizing a single crystal diamond. However, when the single crystal diamond is produced by using a metal solvent, it is inevitable that elements in the catalyst remain in the diamond at an atomic level. If the element in the metal catalyst remains as an impurity in the single crystal diamond particles, the arrangement of the crystal lattice becomes irregular, and it may cause defects, which therefore deteriorates the hardness of the single crystals even if Ni is not contained.

Furthermore, polishing agents or abrasives are also required to be durable so that they can withstand long-term use. Therefore, even if the hardness of the single crystal diamond is high, the polishing speed is likely to be reduced when the crushing strength is inferior, and the durability becomes inferior when used in a grindstone.

Moreover, Patent Document 2 discloses that a crystalline diamond was synthesized in a short time by using the DND. It is unknown whether this crystalline diamond is a single crystal diamond or a polycrystalline diamond, but since the size of the diamond particle is 30 to 250 nm, probably single crystal diamond particles seem to have been produced. However, since diamond is used as the raw material, it is unlikely that single crystal diamond particles would be synthesized in a short time in view of the stability of the surface state. If the diamond particles synthesized in the invention described in Patent Document 2 were supposedly a polycrystalline diamond, they might be less durable compared with the diamond particles synthesized in the invention described in Patent Document 1. If the DND is used as a raw material, the production cost becomes high. And if it is forcible to produce single crystal diamond particles, synthesis conditions over a higher pressure, a more elevated temperature, and a longer time are required, resulting mass productivity is inferior.

An object of the present invention is to provide a method for producing a single crystal diamond capable of synthesizing a single crystal diamond having excellent durability at a low cost and in a short time, and the single crystal diamond.

From the viewpoint of producing a single crystal diamond that can be synthesized at a low cost in a short time, the present inventors first investigated the structure of diamond particles produced by the production method described in Patent Document 2. As a result, it was found that the grain boundaries remained between the DNDs even after the synthesis, and the diamond particles described in Patent Document 2 were polycrystalline diamonds. Therefore, in order to produce single crystal diamond particles in a short time, it is necessary not to use diamond particles as raw materials.

Then, the present inventors have studied a technique for synthesizing a single crystal diamond without using a metal catalyst as described in Patent Document 1 and further without using diamond particles as described in Patent Document 1 as raw materials. Here, as a synthesis technique not containing a metal catalyst or diamond particles as raw materials, for example, Patent Document 3 discloses an example of having synthesized polycrystalline diamond particles by using only graphite as a raw material. However, only fine diamonds having particle sizes of about 10 to 100 nm can be obtained in the example of Patent Document 3. Therefore, in order to use it as an abrasive grain, it is necessary to sinter the fine diamond, and in order to produce a polycrystalline diamond, the production steps become complicated, and the price cannot be suppressed. Moreover, even if the polycrystalline diamond is sintered, the durability is inferior because of the existence of grain boundaries.

The present inventors have conducted diligent experimentation to synthesize a micron-order single crystal diamond by the high-temperature and high-pressure method. In order for graphite to grow as a single crystal diamond, it is necessary to place a raw material that serves as a starting point for graphite to be converted into single crystal diamond in a high-temperature and high-pressure environment. Moreover, if the raw material itself is incorporated into the single crystal diamond, it was considered that distortions and defects of the crystal lattice can be sufficiently avoidable.

Here, a metal catalyst conventionally used has been considered to be effective for conversion from graphite to diamond because it is easily wetted with graphite at the time of melting and increases the dissolution rate of graphite. However, as described above, the metal catalyst remains in the single crystal diamond particles and hinders the improvement of a crushing strength. Moreover, graphite is generally a hexagonal crystal, and a large orientation energy is required to orient a carbon atom to diamond that is an equiaxed crystal, it is difficult to produce diamond in a short time.

The present inventors reexamined the raw materials so that the raw materials used for producing diamond directly contribute to diamond. As raw materials that directly contribute to the growth of a single crystal diamond, carbon compounds and amorphous carbon that were concerned about forming voids due to vaporization in the high-temperature and high-pressure method, were intentionally used. As a result, it was found unexpectedly that the unexpected finding obtained was that micron-order single crystal diamonds with less distortions and defects in the crystal lattice could be synthesized in a short time. Furthermore, the finding also obtained was that the raw material carbon was not crystallized graphite but amorphous carbon, and a single crystal diamond could be produced in a short time, which enabled realization of low price.

In addition to these, it was found that the obtained single crystal diamond particles had a slight amount of crystal nuclei and/or crystal defects derived from the carbon compound. And even if the crystal nuclei or crystal defects remained, the crystal orientations were identical through the entire particle, and the synthesized particles were single crystal diamonds. Moreover, it was found that the single crystal diamond synthesized in such a way had an extremely high purity because a metal catalyst was not used, and since the components other than the carbon of the decomposed carbon compound did not remain in the single crystal diamond particles and were discharged to the outside, they had very few impurities. It was also found to provide high durability.

The present invention obtained from these findings is as follows.

(1) A method for producing a single crystal diamond using a high-temperature and high-pressure method, which comprises synthesizing the diamond by exposing raw materials composed of amorphous carbon and a carbon compound to a pressure and a temperature in a thermodynamically stable region of the diamond in a carbon phase equilibrium diagram.

(2) The method for producing the single crystal diamond according to (1), wherein the amorphous carbon is carbon black.

(3) The method for producing the single crystal diamond according to (1) or (2), wherein the pressure in the thermodynamically stable region is 5 to 10 GPa, and the temperature is 1300 to 1800° C.

(4) The method for producing the single crystal diamond according to any one of (1) to (3), wherein the raw materials are exposed to the thermodynamically stable region for 1 to 300 seconds.

(5) The method for producing the single crystal diamond according to any one of (1) to (4), wherein the carbon compound is an organic compound.

(6) The method for producing the single crystal diamond according to (5), wherein the organic compound is a polyhydric alcohol.

(7) The method for producing the single crystal diamond according to (5) or (6), wherein a carbon constituting the organic compound has an $sp^3$ hybrid orbital.

(8) The method for producing the single crystal diamond according to (1) or (4), wherein the carbon compound is pentaerythritol.

(9) A single crystal diamond with a crystal nucleus and/or a crystal defect derived from a carbon compound.

(10) The single crystal diamond according to (9), wherein the carbon compound is an organic compound.

(11) The single crystal diamond according to (10), wherein the organic compound is a polyhydric alcohol.

(12) The single crystal diamond according to (11), wherein a carbon constituting the organic compound has an $sp^3$ hybrid orbital.

(13) The single crystal diamond according to (9), wherein the carbon compound is pentaerythritol.

(14) The single crystal diamond according to any one of (9) to (13), which has an average particle size of 0.25 to 50 μm.

BRIEF DESCRIPTION OF THE INVENTION

The terms Fig., Figs., Figure, and Figures are used interchangeably in the specification to refer to the corresponding figures in the drawings.

FIG. 3 (*a*) illustrates a Chechevitsa type, and FIG. 3 (*b*) illustrates a toroid type.

FIG. 5 (*a*) is a photograph of a sample appearance taken after the high-temperature and high-pressure treatment, and FIG. 5 (*b*) is an SEM photograph of the diamond in the sample illustrated in FIG. 5 (*a*).

FIG. 6 (*a*) is Raman spectra of graphite and carbon black, FIG. 6 (*b*) is a Raman spectrum of pentaerythritol, and FIG. 6 (*c*) is Raman spectra of a natural diamond and the single crystal diamond produced under the conditions of Example 2.

FIGS. 7 (*a*) and 7 (*b*) are the single crystal diamond particles of Example 2, and FIGS. 7 (*c*) and 7 (*d*) are the polycrystalline diamond particles of Comparative Example 8.

DETAILED DESCRIPTION

1. Outline of Production Method of Single Crystal Diamond

The method for producing a single crystal diamond according to the present invention is a method for producing a single crystal diamond using a high-temperature and high-pressure method, which comprises synthesizing the diamond by exposing raw materials composed of amorphous carbon and a carbon compound to a pressure and a temperature in a thermodynamically stable region of the diamond in a carbon phase equilibrium diagram.

The production method according to the present invention is an epoch-making method daringly using a carbon compound and amorphous carbon that are treated as impurities in the high-temperature and high-pressure method and are considered to be the cause of voids due to the decomposition components, as starting materials for synthesizing single crystal diamond particles. Here, in a diamond synthesis technique using a chemical vapor deposition method, it is difficult to produce a single crystal diamond particle having a diameter of 1 μm or more from powders such as graphite, carbon black, and amorphous carbon. Therefore, the high-temperature and high-pressure method is the most suitable for synthesizing the single crystal diamond particles from these, which will be described in detail with reference to figures below.

Figure 1:
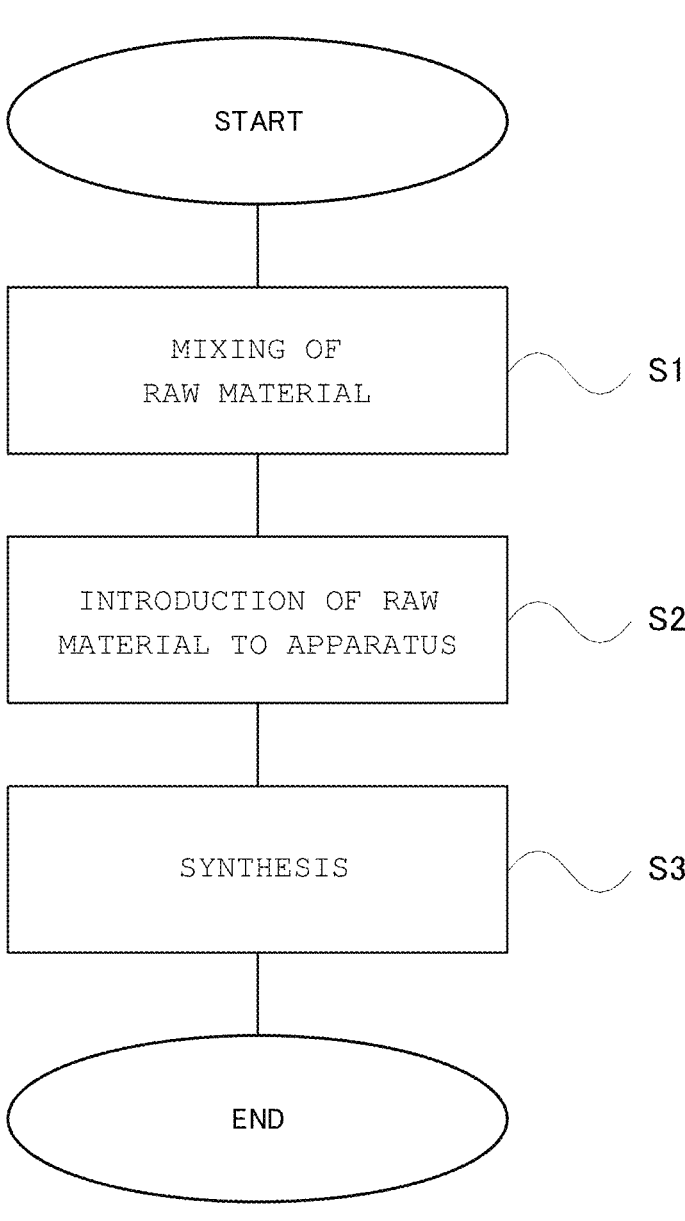
FIG. 1 is a block diagram illustrating a step of producing single crystal diamond particles according to the present invention.

FIG. 1 is a block diagram illustrating a step producing single crystal diamond particles according to the present invention. Specifically, as shown in FIG. 1, the method for producing the single crystal diamond according to the present invention comprises (1) a step of mixing starting materials composed of amorphous carbon and a carbon compound, and (2) a step of introducing the mixed raw material to a pressure medium, and (3) a step of exposing the mixed raw material to a pressure and a temperature in a thermodynamically stable region of the diamond in a phase equilibrium diagram of graphite. These will be described in detail below.

(1) Step of Mixing Starting Materials Composed of Amorphous Carbon and Carbon Compounds The "amorphous carbon" used in the production method according to the present invention refers to carbon composed of carbon, etc., which is amorphous materials and has no constant crystal structure. Among these, solid carbons that facilitate handling are preferred, and carbon black is preferred. Moreover, it may also contain unavoidable impurities.

In the present invention, those having constant crystal structures, such as diamond and graphite are excluded from the "amorphous carbon" in the present invention. Moreover, the "carbon compound" to be described later is also excluded from the "amorphous carbon".

In the production method according to the present invention, a single crystal diamond can be produced without limits on the purity of the raw material. Desirably, the amorphous carbon containing carbon black has an impurity concentration of less than 30 ppm and an arithmetic mean particle size of 16 to 200 nm. It is more preferably 16 to 100 nm and even more preferably 16 to 70 nm. Within this range, it is not necessary to complicate the temperature profile and pressure profile.

The carbon compound used in the present invention is not particularly limited provided that it is a compound containing C, and includes, for example, inorganic materials containing carbon monoxide, carbon dioxide, prussic acid, cyanates, and thiocyanates, and organic materials. However, it does not contain amorphous carbon and metal salt. The carbon compound is not particularly limited, and is not limited provided that it is a substance that can be pyrolyzed and carbonizes such as tire, toner, hair, wood and waste plastics. When such recycled resources are used, they can be used as raw materials if they are crushed into small pieces so as to be facilitated to be carbonized by thermal decomposition. Moreover, it also includes solids such as coal, coke, charcoal, soot and Glassy carbon; liquids such as naphtha (gasoline), kerosene, light oil and heavy oil; and gases such as natural gas.

Further, the carbon compound is preferably an organic compound, preferably liquid or a solid at room temperature, and particularly preferably a solid that facilitates handling as a raw material. The organic compound is more preferably composed of a hydrogen atom, an oxygen atom, and a carbon atom so that an element that not contributing to diamond does not remain during the synthesis and is decomposed and discharged to the outside during the synthesis.

In addition to above, the carbon compound used in the present invention includes aliphatic hydrocarbon, an aromatic hydrocarbon, and an alicyclic hydrocarbon. They may be saturated or unsaturated hydrocarbons, and they may be monomers, oligomers, polymers.

For example, alkanes such as methane, ethane, propane, butane, pentane, hexane, heptane, octane, nonane, decane, alkenes such as ethene (ethylene), propene (propylene), butene (butylene), pentene, hexene, heptene, octene, non-ene, decene, alkynes such as ethine (acetylene), propyne (methylacetylene), butine, pentane, hexyne, heptin, octyne, nonine, decine, cycloalkanes such as cyclopropane, cyclobutane, cyclopentane, cyclohexane, cycloheptane, cyclooctane, cyclononane, cyclodecane, arkadiene such as propadien (allene), butadiene, pentadiene (piperylene), hexadiene, heptadiene, octadiene, nonadien, decadien, etc. are exemplified. These may have substituents such as a hydroxyl group, a sulfon group, a nitro group, a nitroso group, an epoxy group, an aldehyde group, an amino group, an acyl group, a carbonyl group, a carboxyl group, these may be an oligomer, and these may be a polymer such as polyethylene, polypropylene, or polyethylene terephthalate.

Moreover, as in the case of the single crystal diamond, a shoulder peak is preferably observed in the vicinity of 1330 to 1340 cm-1 in a Raman spectrum. Further, the organic compound preferably has a carbon atom having an sp3 hybrid orbital, and it preferably has 1 to 10 carbon atoms, preferably 4 to 6 carbon atoms, and particularly preferably 5 carbon atoms, and the organic compound is particularly preferably a polyhydric alcohol. The polyhydric alcohol is preferably an alcohol being trihydric to octahydric, and being tetrahydric is more preferred. It is even more preferable that all carbon elements in the polyhydric alcohol further preferably have sp3 hybrid orbitals.

Diamond has a tetrahedral structure with sp3 hybrid orbitals, and if this carbon structure is present in a carbon compound, it functions as a crystal nucleus when synthesized. Therefore, in order to promote growth of diamond more efficiently, the carbon compound preferably contains a carbon structure having an sp3 hybrid orbital, and preferably has a branch. Further, in addition to these, the carbon compound preferably has a structure close to the tetrahedral structure of diamond. In addition to these, a tetrahedral structure composed of five carbon atoms is most preferred. The terminal thereof may have a hydroxyl group, and a polyhydric alcohol is preferred from the viewpoint of being released as a desorbed gas when heated.

In the present invention, the reason why a single crystal diamond having excellent durability can be synthesized at a further lower cost, a higher yield and in a shorter time by using the aforementioned preferred amorphous carbon and carbon compound, is conjectured as follows.

The conventional high-temperature and high-pressure method uses a molten metal and graphite. When the molten metal melts at an elevated temperature, graphite is decomposed by the molten metal to produce diamond. However, since the amorphous carbon that is no constant crystal structure, has a random structure and facilitates structural conversion to diamond, compared with carbon having a specific structure. Therefore, it is conjectured that unlike the conventional case where high energy is required for structural change of graphite by a molten metal, if there exists an organic compound having an sp3 hybrid orbital as a nucleus material, it becomes a starting point of conversion from carbon to diamond, facilitating formation of diamond.

Moreover, the hydroxyl groups in the raw material exposed to a high-temperature and high-pressure environment react with amorphous carbon to be eliminated as $CO$ and $CO2$. The carbon having the remaining sp3 hybrid orbital becomes the crystal nucleus that is the minimum structure of the diamond crystal. Then, this crystal nucleus becomes the starting point, and the amorphous carbon is converted into a diamond structure. Therefore, in the present invention, it is conjectured that single crystal diamond particles having few defects and excellent durability can be produced at a low cost and in a high yield.

Examples of the polyhydric alcohols include ethylene glycol, propylene glycol, diethylene glycol, trimethylene glycol, tetraethylene glycol, triethylene glycol, dipropylene glycol, 1,4-butanediol, 1,3-butanediol, 2,3-butanediol, 1,2-butanediol, 2-methyl-1,3-propanediol, 3-methyl-1,2-butanediol, 2-butyl-2-ethyl-1,3-propanediol, 1,2-pentanediol, 1,5-pentanediol, 1,4-pentanediol, 2,4-pentanediol, 2,3-dimethyltrimethylene glycol, tetramethylene glycol, 3-methyl-4,3-pentanediol, 3-methyl-1,5-pentanediol, 2,2,4-trimethyl-1,3-pentanediol, 1,6-hexanediol, 1,5-hexanediol, 1,4-hexanediol, 2,5-hexanediol, neopentyl glycol, 1,4-cyclohexanedimethanol, tricyclodecanedimethanol, hydroxypivalic acid neopentyl glycol ester, glycerin, trimethylolethane, trimethylolpropane, diglycerin, xylitol, triglycerin, 1,2,6-hexanetriol, pentaerythritol, dipentaerythritol, tris(2-hydroxyethyl)isocyanuric acid, sorbitol, perseitol and sucrose.

Among these, examples of the trihydric alcohols include glycerin and trimethylolpropane. Examples of the tetrahydric alcohols include pentaerythritol and diglycerin. Examples of the pentahydric alcohols include xylitol. Examples of the hexahydric alcohols include sorbitol. Examples of the heptahedron alcohols include perseitol.

Examples of the octahydric alcohols include sucrose. Among these, the tetrahydric alcohol is preferred, and pentaerythritol is most preferred.

The aforementioned carbon compound may be one type or a mixture of two or more types thereof, and the aforementioned carbon compound may contain unavoidable impurities. Even if it contains unavoidable impurities, it does not affect the aforementioned effects.

In the present invention, the combination of the amorphous carbon and the carbon compound is preferably that of the amorphous carbon being carbon black and the carbon compound being a polyhydric alcohol having an sp3 hybrid orbital and a tetrahedral structure, and the most preferred combination is that of carbon black and pentaerythritol. With this combination, 95% or more and preferably 99% or more of the raw material relative to the total weight thereof may be converted to diamond.

A mixing ratio of the amorphous carbon and the carbon compound is desirably (amorphous carbon):(carbon compound)=7:3 to 4:6 from the viewpoint of pressure attenuation due to volume shrinkage during conversion from amorphous carbon to diamond, and it is particularly desirably 6:4 to 5:5. After weighing the amorphous carbon and the carbon compound in the above range, the starting materials are mixed. The mixing method may be a general method. For example, the starting material may be placed in a powder mixer and mixed at atmospheric pressure or reduced pressure for about 1 to 30 minutes. As a result, a mixed powder of 100 μm or less can be obtained.

(2) Step of Introducing Mixed Raw Material into Pressure Medium

The mixed powder mixed as described above is packed in, for example, a pressure medium equipped with a graphite heater, and set in a pressurized portion of a high-temperature and high-pressure apparatus.

The high-temperature and high-pressure apparatus used for synthesizing diamond particles by the high-temperature and high-pressure method is not particularly limited provided that it can retain 5 to 10 GPa at 1000 to 1400° C. for about 1 minute, as will be described below. In order to carry out the synthesis under such conditions, it is necessary to apply a static external force to the mixed raw material with an anvil. Various pressurization forms for applying an external force can be adopted. For example, an anvil-cylinder type, such as a belt type represented by a single-axis press, an opposed-anvil-type toroid type and a Chechevitsa type, a tetrahedral type of a multi-axis press, and a multi-anvil type are included.

Figure 2:
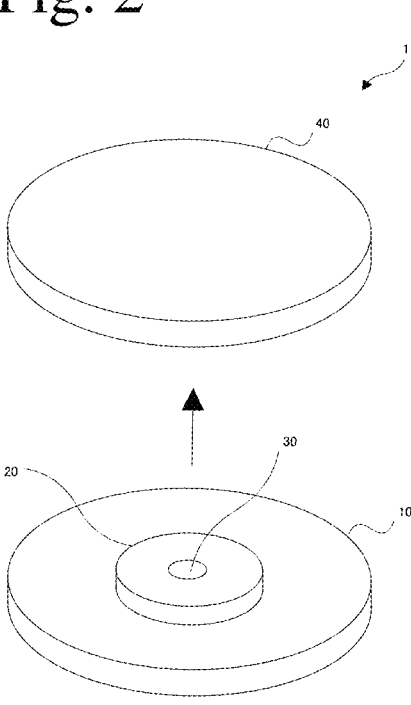
FIG. 2 is a perspective view of a pressurized portion in an opposed-anvil-type high-pressure and high-temperature apparatus.

FIG. 2 is a perspective view of a pressurized portion 1 in the opposed-anvil-type high-pressure and high-temperature apparatus. A pressure medium 20 formed of calcium carbonate, etc., is set in a lower anvil 10. In a cavity 30 at the center of the pressure medium 20, for example, a mixed raw material packed in a graphite tube is introduced. After that, the lower anvil 10 in which the mixed raw material is set in the pressure medium 20 is pressed against an upper anvil 40, and the raw material is brought into a high-pressure and high-temperature state described later to synthesize single crystal diamond particles.

Figure 3:
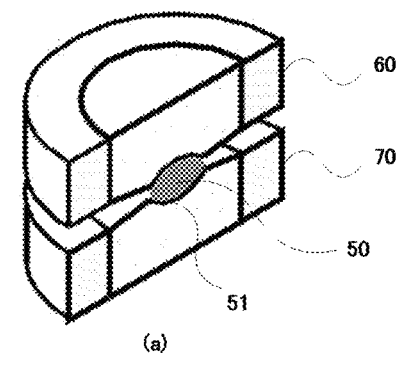
FIG. 3 is a partial, cross-sectional perspective view illustrating a pressurized portion of a high-pressure apparatus used in a step of producing single crystal diamond particles.
Figure 3:
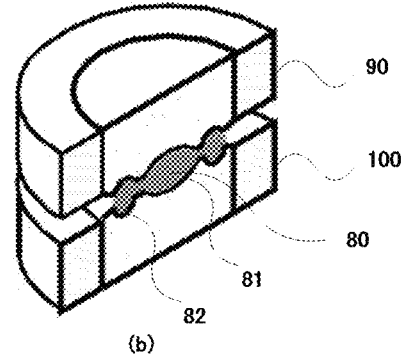

FIG. 3 is a partial, cross-sectional perspective view illustrating a pressurized portion of a high-pressure apparatus used in the step of producing the single crystal diamond particles. FIG. 3 (a) illustrates a Chechevitsa type, and FIG. 3 (b) illustrates a toroid type. As shown in FIG. 3 (a), in the Chechevitsa type, a pressure medium 50 that the raw material is introduced into a recessed portion 51 in the center, placed in advance there is interposed between upper and lower anvils 60 and 70, and by application of high pressure, can be properly crashed inside the recessed portion to hold the pressure applied to the raw material without pressure reduction. As shown in FIG. 3 (*b*), in the toroid type, an annular recessed portion 82 is further provided around a recessed portion 81 in the center. The annular recessed portion 82 is formed in an annular shape when viewed from above in the drawing, and the pressure medium 80 is crushed and tries to leak from the recessed portion 81, however, since the annular recessed portion 82 can prevent the crashed pressure medium from flowing, the reduction of the pressure can be inhibited even after an elapse of pressurization time. In FIG. 3 (*b*), one annular recessed portion 82 is provided, but another annular recessed portion is preferably provided in the periphery thereof.

Figure 4:
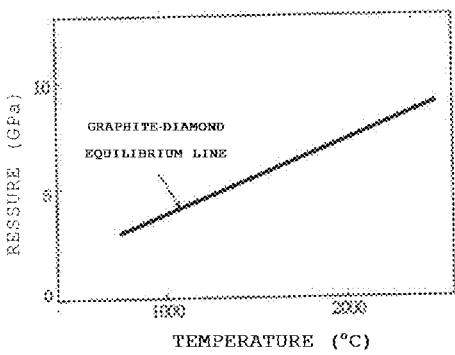
FIG. 4 is a phase equilibrium diagram of carbon.

(3) Exposing Mixed Raw Material to Pressure and Temperature within Thermodynamically Stable Region of Diamond in Phase Equilibrium Diagram of Graphite After the raw material is set in the high-pressure apparatus as described above, the raw material is exposed to a predetermined pressure and temperature with the anvil. FIG. 4 illustrates a phase equilibrium diagram of graphite. As shown in FIG. 4, the diamond is thermodynamically stable in the region above the graphite-diamond equilibrium line, and the pressure and temperature are set in this region. Moreover, the pressure and temperature profile are not particularly limited, but various conditions can be determined in consideration of the homogenization of temperature and pressure of the starting material, graphite recrystallization, the nucleation, and the particle growth. It is usually desirable to gradually increase the pressure and temperature, but it will take time to complete the diamond synthesis.

From this point of view, the pressure in the thermodynamically stable region is preferably 5 to 10 GPa, and the temperature is preferably 1300 to 1800° C. When the pressure is 5 GPa or more, micro-sized diamond particles can be obtained, and a high conversion ratio from carbon black to diamond can be obtained. The same applies even if the temperature is 1300° C. or higher. The pressure is more preferably 6 GPa or more, and the temperature is further preferably 1400° C. or higher.

On the other hand, if the pressure is 10 GPa or less, an excessive load is not applied to the pressure apparatus, also the pressure medium does not leak from the gap, and the initial pressure is maintained regardless of an elapse of time. Moreover, as shown in FIG. 4, if the applied pressure is within the above range, the state is suitable as long as it is within the thermodynamically stable region, and the temperature does not need to be higher than necessary. The pressure is more preferably 9.5 GPa or less, further preferably 8 GPa or less, and the temperature is more preferably 1700° C. or lower and still more preferably 1600° C. or lower. In the present invention, it is preferred to raise the pressure to the above range and then raise the temperature to the above range from the viewpoint of a diamond yield.

The time for which the raw material is exposed to the thermodynamically stable region is preferably 1 to 300 seconds. Within this time, a high conversion ratio from carbon black to diamond can be obtained. Moreover, within 300 seconds, the decrease in pressure caused by the crushed pressure medium leaking from the gap can be inhibited. The time for which the raw material is exposed to the thermodynamically stable region is more preferably 2 to 70 seconds, still more preferably 3 to 10 seconds, and particularly preferably within 4 to 7 seconds. This time range is the time of exposure to the thermodynamically stable region, and is preferably a time when the pressure and temperature are within the above ranges.

The pressure profile and the temperature profile are not particularly limited, and the pressurization rate and the temperature rise rate may be set within the specifications of the apparatus, and the pressurization rate is preferably higher and may be 0.5 GPa/sec or more and more preferably 3 GPa/sec or more. The temperature rise rate is preferably higher, and may be 300° C./sec or higher.

By exposing the starting material to a high temperature and a high pressure under the above conditions, the carbon black is instantly converted to a single crystal diamond, and the carbon of the carbon compound is incorporated into the single crystal diamond. Therefore, according to the preferred method for producing the single crystal diamond according to the present invention, it can be produced in a short time of several seconds to several tens of seconds in a high yield of 90% or more or 99% or more.

2. Single Crystal Diamond (1) Outline of Single Crystal Diamond

The single crystal diamond particle according to the present invention produced by the aforementioned method for producing a single crystal diamond, has a crystal nucleus and/or a crystal defect derived from the carbon compound. In the case of conventional diamond particles, if the crystal nucleus and the crystal defect remain, a crystal interface is formed on the surface containing these, resulting in forming of polycrystals. However, the single crystal diamond according to the present invention has the same crystal orientations in the entire region including these and the periphery thereof, and the synthesized diamond particles are single crystals.

Moreover, the single crystal diamond particle according to the present invention has an extremely high purity due to no use of the metal catalyst as described above, and since components other than carbon of the decomposed carbon compound do not remain in the single crystal diamond particle and are discharged to an outside, it has very few defects, and thereby high durability can be fulfilled.

(2) Crystal Nuclei and/or Crystal Defects Derived from Carbon Compounds

The single crystal diamond particle according to the present invention has a crystal nucleus and/or a crystal defect derived from the carbon compound. When stress is applied to the single crystal diamond particle from an outside, the stress is relaxed by the crystal nuclei and crystal defects to form a single crystal, therefore high durability is exhibited.

Figure 7:
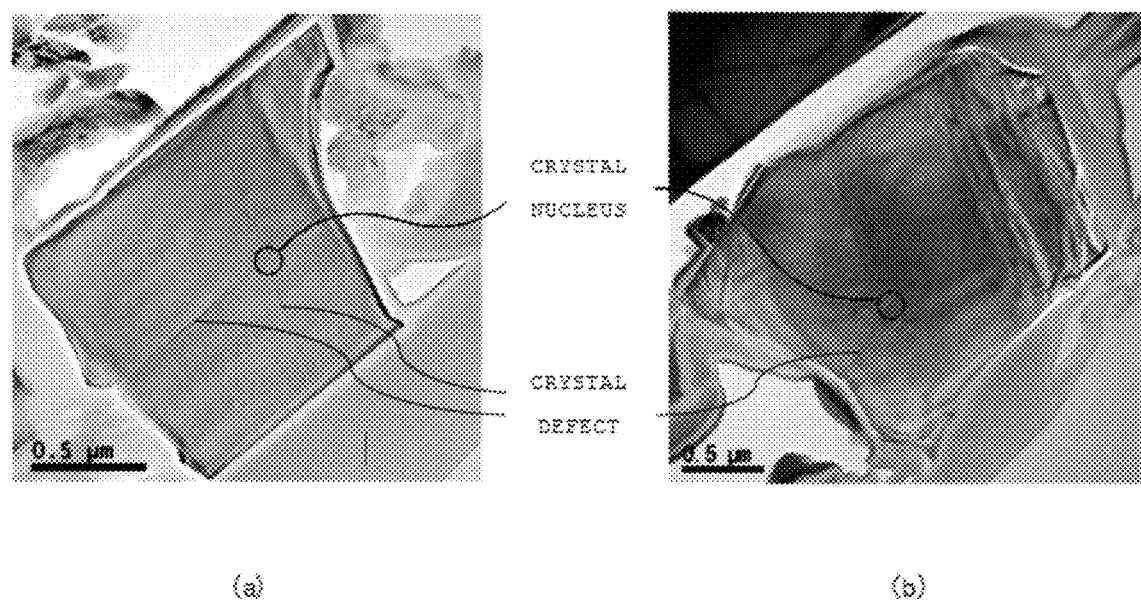
FIG. 7 is a photograph of a transmission electron microscope (TEM) image of diamond particles.
Figure 7:
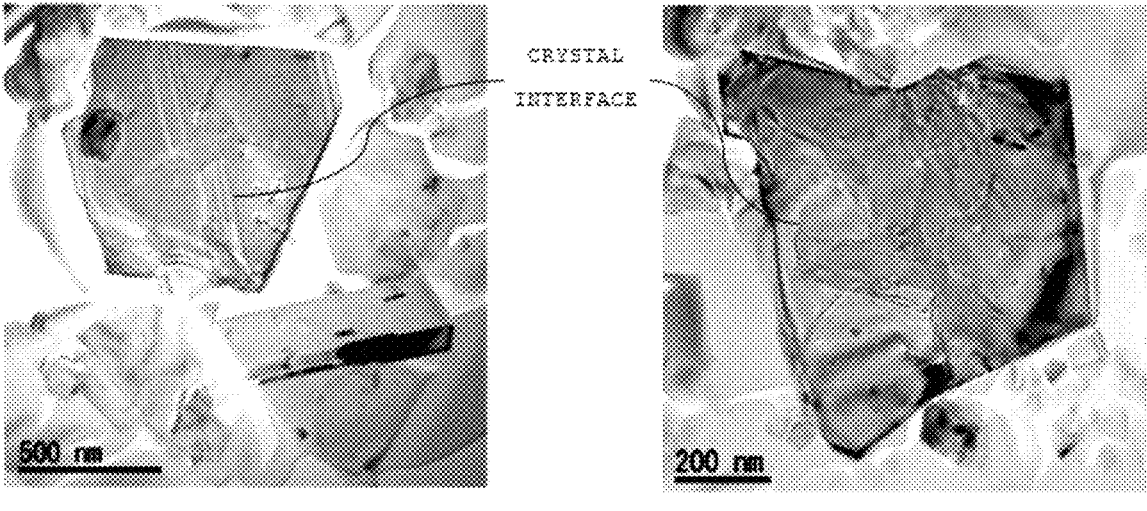

The crystal nuclei and crystal defects in the present invention can easily be observed by TEM, etc. For example, as shown in FIG. 7 (*a*), the vertical and horizontal lines are crystal defects, and the central portion thereof is the crystal nucleus. The line in FIG. 7 (*a*) is a defect, but this defect happens to be observed on the surface of the photograph and does not reach the depth of the particle. Even if such a slight defect is present, high durability can be exhibited because the crystal orientations are aligned in the entire region including the crystal nucleus and the periphery thereof.

The crystal nuclei and crystal defects in the present invention are derived from the carbon compound described in the aforementioned production method, the carbon compounds are the same as those described above, and therefore the explanation thereof will be omitted. The crystal nucleus of the single crystal diamond particle according to the present invention has the structure of the carbon compound before formation to some extent, and the number thereof is preferably 1 to 3, and if it is 1, stress can be sufficiently relaxed.

(3) Average Particle Size

The average particle size of the single crystal diamond particle according to the present invention is preferably 0.25 to 50 μm, more preferably 1 to 30 μm, further preferably 2 to 30 μm, particularly preferably 3 to 30 μm, most preferably 4 to 28 μm. Within this range, the particle is not too large and can be used for a wide range of purposes. In the present invention, for example, a D50 value, which is the volume-average diameter, obtained by a laser diffraction/scattering type particle size distribution measurement apparatus (for example, model: Mastersizer 2000 manufactured by Malvern Instruments Ltd., and model: Microtrac MT3000, Microtrac UPA, manufactured by MicrotracBell Corp., etc.) can be used as the average particle size.

(4) Raman Spectrum

The single crystal diamond particle according to the present invention has a sharp peak in the vicinity of 1332 cm$^{-1}$ in the same manner as a natural single crystal diamond. Therefore, the distortions and defects of the crystal lattice are extremely small, and excellent durability is exhibited.

EXAMPLES

The present invention is not limited to the Examples shown below.

1. Fabrication of Diamond Particle

First, carbon black powder with an arithmetic average particle size of 40 nm (manufactured by Tokai Carbon Co., Ltd., trade name: TOKABLACK #4500) with an arithmetic average particle size of 20 to 40 nm, were used as amorphous carbons, or graphite was used. Pentaerythritol (manufactured by Tokyo Chemical Company Co., Ltd., product code (P0039)), xylitol (manufactured by Tokyo Chemical Company Co., Ltd., product code (X0018)), polyethylene (product name: Kitchen Pack, manufactured by Nissin Chemical Co., Ltd.) cut with commercially available scissors, or methanol (product number: 25183-70, manufactured by Kanto Chemical Co.), were used as carbon compounds. Then these were weighed as shown in Table 1 and placed in a powder mixer to obtain mixed powder. When the DND was used, DND powder having a volume-average diameter, a D50 value of 2 to 100 nm measured by a laser diffraction/scattering type particle size distribution measurement apparatus (for example, manufactured by MicrotracBell Corp., model: MicrotracUPA) was used, and this DND powder and pentaerythritol were weighed as shown in Table 1 and placed in a powder mixer to obtain mixed powder. These mixed powders were packed in a graphite tube and introduced into a cavity portion of a disk-shaped CaCO$_3$ pressure medium.

Diamond synthesis was carried out in a "toroid" type high pressure chamber. The generated pressure was calibrated by the phase transition of Bi, Tl and Ba at room temperature. The set temperature was calibrated with an input power and a temperature by using a thermocouple. The raw material was heated by a direct heating method passing an electric current through a graphite heater. By using these apparatus configurations, the powder raw material was exposed to a high temperature and a high pressure under the conditions shown in Table 1.

Figure 5:
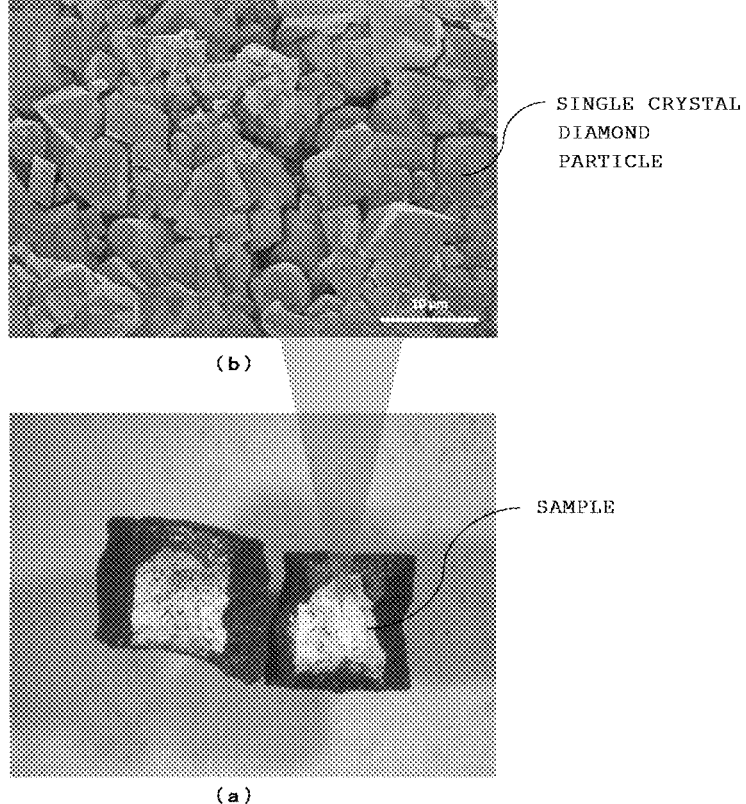
FIG. 5 is a photograph of the single crystal diamond according to the present invention.

As shown in FIG. 5 (a), the sample synthesized by the high-temperature and high-pressure method was in a state of being mixed with the pressure medium when the decompression was completed. Therefore, first, the particles in the pressure medium were removed with a sieve, and then washed with deionized water. Next, the powder was placed in a liquid of bromoform (CHBg$_3$) to separate the carbon black and diamond particles. The diamond particles were filtered and washed with deionized water to obtain diamond particles.

Figure 6:
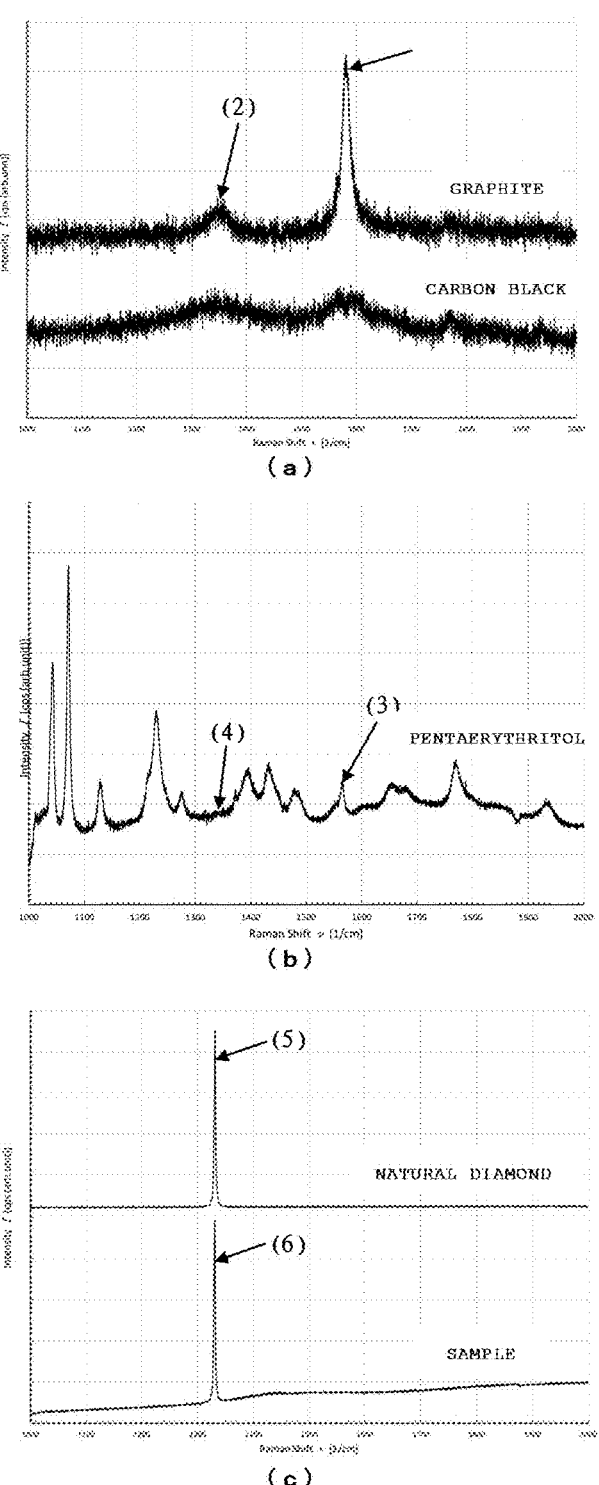
FIG. 6 illustrates views of Raman spectra.

Two arbitrary particles were extracted from the obtained diamond particles and observed with an optical microscope (OM) as shown in FIG. 5 (a), and the morphology of the obtained particles was observed with a field emission scanning electron microscope (FE-SEM) as shown in FIG. 5 (b). The diamond was identified by Raman spectroscopic analysis (manufactured by JEOL Ltd., apparatus name: Laser Raman spectrometer, model number: NRS-7500) as shown in FIG. 6 (c), and as shown in FIG. 7, crystallinity was investigated with an image of a transmission electron microscope (manufactured by JEOL Ltd., apparatus name: Transmission Electron Microscope: TEM, model name: JEM-ARM200F). Moreover, it was examined by an image of the transmission electron microscope whether graphite was included in the carbon black used in the present Example.

The yield was defined as a value (%) obtained by dividing the mass of the obtained diamond particles by the total mass of the raw materials and then multiplying the divided value by 100. If it is not 0%, a single crystal micron-order diamond can be produced, and if the yield is 90% or more, it can be said to be a high yield. If the yield is 99% or more, the yield is extremely high, from which early implementation is expected.

The obtained crystal average particle size was measured with a volume-average particle size D50 as the average particle size by a laser diffraction/scattering type particle size distribution measurement apparatus (for example, manufactured by Malvern Instruments Ltd., model: Mastersizer 2000).

When the particle size was 1 μm or more and a single crystal diamond could be produced, it was evaluated as "Good". When the single crystal micron diamond could not be produced, it was described as "-". In the case of polycrystals, it was described as "Polycrystal".

The results are shown in Table 1.

TABLE 1

| | Raw material 1 | Raw material 2 | Applied pressure (GPa) | Temperature (° C.) | Time (second) | Yield (%) | Particle size (μm) | Production of single crystal micron diamond |
|---|---|---|---|---|---|---|---|---|
| Example 1 | Carbon black (5 parts by mass) | Pentaerythritol (5 parts by mass) | 9.5 | 1300 | 10 | 99 | 15 | ○ |
| Example 2 | Carbon black (6 parts by mass) | Pentaerythritol (4 parts by mass) | 7.5 | 1500 | 5 | 99 | 10 | ○ |
| Example 3 | Carbon black (6 parts by mass) | Pentaerythritol (4 parts by mass) | 5 | 1800 | 3 | 3 | 7 | ○ |
| Example 4 | Carbon black (5 parts by mass) | Pentaerythritol (5 parts by mass) | 7.5 | 1500 | 70 | 90 | 30 | ○ |

TABLE 1-continued

| | Raw material 1 | Raw material 2 | Applied pressure (GPa) | Temperature (° C.) | Time (second) | Yield (%) | Particle size (μm) | Production of single crystal micron diamond |
|---|---|---|---|---|---|---|---|---|
| Example 5 | Carbon black (5 parts by mass) | Xylitol (5 parts by mass) | 7.5 | 1500 | 10 | 50 | 10 | ○ |
| Example 6 | Carbon black (7 parts by mass) | Pentaerythritol (3 parts by mass) | 8 | 1350 | 5 | 60 | 10 | ○ |
| Example 7 | Carbon black (6 parts by mass) | Pentaerythritol (4 parts by mass) | 10 | 1400 | 7 | 70 | 15 | ○ |
| Example 8 | Carbon black (6 parts by mass) | Pentaerythritol (4 parts by mass) | 7.5 | 1500 | 1 | 30 | 10 | ○ |
| Example 9 | Carbon black (6 parts by mass) | Pentaerythritol (4 parts by mass) | 7.5 | 1500 | 300 | 70 | 20 | ○ |
| Example 10 | Carbon black (5 parts by mass) | Polyethylene (5 parts by mass) | 8 | 1350 | 5 | 20 | 10 | ○ |
| Example 11 | Carbon black (5 parts by mass) | Polyethylene (5 parts by mass) | 8 | 1350 | 3 | 5 | 10 | ○ |
| Comparative Example 1 | Carbon black (10 parts by mass) | — | 7.5 | 1500 | 10 | 0 | — | — |
| Comparative Example 2 | — | Polyethylene (10 parts by mass) | 7.5 | 1500 | 10 | 0 | — | — |
| Comparative Example 3 | Graphite (5 parts by mass) | Pentaerythritol (5 parts by mass) | 5 | 1300 | 10 | 0 | — | Polycrystal |
| Comparative Example 4 | Carbon black (5 parts by mass) | Pentaerythritol (5 parts by mass) | 3 | 1500 | 5 | 0 | — | — |
| Comparative Example 5 | Carbon black (5 parts by mass) | Pentaerythritol (5 parts by mass) | 15 | 1300 | 5 | 0 | — | — |
| Comparative Example 6 | Carbon black (5 parts by mass) | Pentaerythritol (5 parts by mass) | 7.5 | 800 | 5 | 0 | — | — |
| Comparative Example 7 | Carbon black (3 parts by mass) | Pentaerythritol (7 parts by mass) | 5 | 1300 | 5 | 0 | — | — |
| Comparative Example 8 | DND (5 parts by mass) | Pentaerythritol (5 parts by mass) | 7.5 | 1350 | 30 | 99 | 10 | Polycrystal |

As is clear from Table 1, all the diamond particles of the Examples were single crystals, and the crystal nuclei could be observed. In particular, as is clear from Examples 1, 2 and 4, it was revealed that the single crystal micron diamond particles were produced in a high yield in a short time.

On the other hand, the diamond particles could not be produced in Comparative Example 1 and Comparative Example 2 because carbon black or pentaerythritol was not used. It was found that since graphite was used as a raw material for the diamond particles in Comparative Example 3, although diamond grew with pentaerythritol as a crystal nucleus, a crystal interface was present, resulting in forming of polycrystals. Due to the unfavorable production conditions for the diamond particles in Comparative Examples 4 to 7, single crystal micron diamond particles could not be produced. It was found that in Comparative Example 8, since the DND was used as a raw material, the DND was stably present as diamond in the thermodynamically stable region, and therefore, although the DND grew with pentaerythritol as the crystal nuclei, a crystal interface was present, resulting in forming of polycrystals.

FIG. 6 illustrates a diagram of a Raman spectrum. FIG. 6 (a) is a Raman spectrum of graphite and carbon black, FIG. 6 (b) is a Raman spectrum of pentaerythritol, and FIG. 6 (c) is Raman spectra of a natural diamond and the single crystal diamond particles produced under the conditions of Example 2. Graphite and carbon black used in the present Examples show significantly different Raman spectra as shown in FIG. 6 (a). In graphite, a sharp peak in the vicinity of 1580 cm$^{-1}$ and a shoulder peak in the vicinity of 1330 cm$^{-1}$ were observed. On the other hand, since the carbon black was an amorphous carbon, no sharp peak was observed in the vicinity of 1580 cm$^{-1}$, it was observed that the graphite and the carbon black had significantly different crystal structures.

Figure 8:
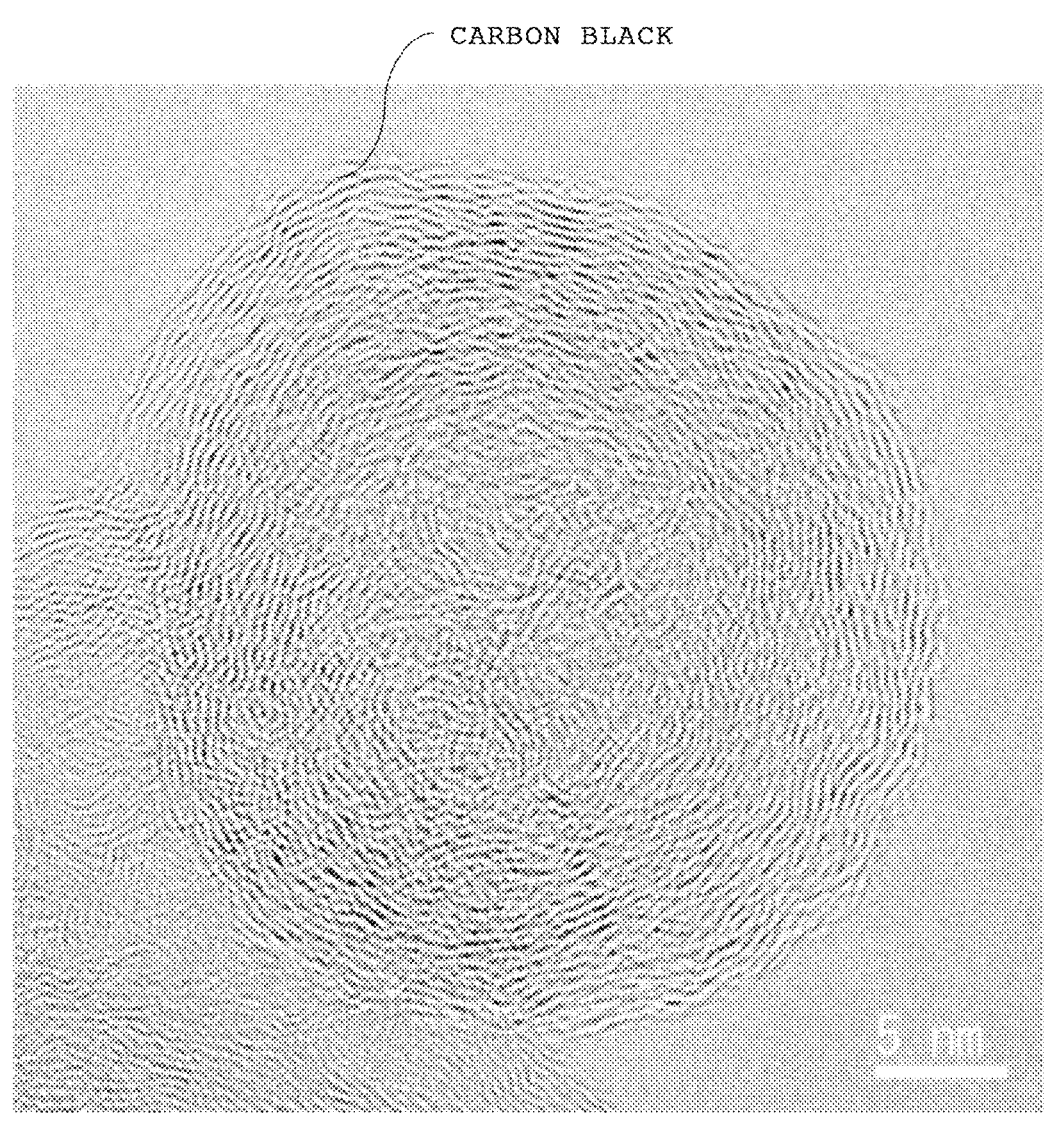
FIG. 8 is a TEM photograph of carbon black used in the Examples.

Since the carbon black is an amorphous carbon, no peak should be observed in the Raman spectrum, but the shoulder peaks were seen in the vicinity of 1330 cm$^{-1}$ and 1580 cm$^{-1}$. However, as will be described later, the carbon black used in the present Examples does not contain graphite as shown in FIG. 8. Therefore, it is considered that the shoulder peak observed in the Raman spectrum of the carbon black is not derived from graphite included in the raw material, but from graphite formed from a portion of the carbon black by a laser during Raman spectroscopic measurement. As shown in FIG. 6 (b), for pentaerythritol, a small shoulder peak was observed in the vicinity of 1330 to 1340 cm$^{-1}$, elucidating that the pentaerythritol was optimal as a crystal nucleus that is to be a starting point for diamond growth. As shown in FIG. 6 (c), since a sharp peak peculiar to a single crystal diamond was observed at 1332 cm$^{-1}$ in both the natural diamond and the present Examples, it was found that the single crystal diamond could be produced in the present Examples. Moreover, it was also found that in the present Examples, micron single crystal diamond particles having extremely few distortions and defects in the crystal lattice could be produced.

FIG. 7 illustrates a TEM photograph of diamond particles. FIGS. 7 (a) and 7 (b) illustrate single crystal diamond particles of Example 2, and FIGS. 7 (c) and 7 (d) are polycrystalline diamond particles of Comparative Example 8. As is clear from FIGS. 7 (a) and 7 (b), the crystal nuclei could be observed in the diamond particles of Example 2, and the entire particle had the same crystal orientations, and each particle was found to be a single crystal diamond particle. On the other hand, as is clear from FIGS. 7 (c) and 7 (d), it was found that since the diamond particles of Comparative Example 8 were observed to have gray shades between a large number of lines as boundaries, indicating that a large number of crystal interfaces was present, and the diamond particles were polycrystals rather than single crystals.

FIG. 8 is a TEM photograph of the carbon black used in the Examples. As shown in FIG. 8, the carbon black used in the Examples was observed to have no graphite-derived six-membered ring, and thus it was clarified that the carbon black did not contain graphite.

Conventionally, it has been said that diamond cannot be synthesized without even a small amount of graphite in the raw material. However, in the present Examples, it has been clarified that even when the raw material does not contain any graphite, a single crystal diamond having excellent durability can be synthesized at low cost and in a short time.

REFERENCE SIGNS LIST

1: Pressurized portion, 10, 40, 60, 70: anvils, 20, 50, 80: pressure media, 30: cavity, 51, 81: recessed portions, 82: annular recessed portion

The invention claimed is:

1. A method for producing a single crystal diamond using a high-temperature and high-pressure method, which comprises synthesizing the diamond by mixing raw materials consisting of amorphous carbon and carbon compounds having hydrogen and/or hydroxyl groups in a mass ratio of the amorphous carbon: the carbon compounds=7:3 to 4:6, and retaining under conditions of pressure of 5 to 10 GPa and temperature of 1300 to 1800° C. for 1 to 300 seconds.

2. The method for producing the single crystal diamond according to claim 1, wherein the amorphous carbon is carbon black, and wherein the carbon compounds are at least one of aliphatic hydrocarbons, alcohols, and polyhydric alcohols.

3. The method for producing the single crystal diamond according to claim 2, wherein the aliphatic hydrocarbon is polyethylene, wherein the alcohol is methanol, and wherein the polyhydric alcohol is pentaerythritol or xylitol.

4. The method for producing the single crystal diamond according to claim 1, wherein a peak near 1332 $cm^{-1}$ exists in the Raman spectrum.

5. The method for producing the single crystal diamond according to claim 2, wherein a peak near 1332 $cm^{-1}$ exists in the Raman spectrum.

6. The method for producing the single crystal diamond according to claim 3, wherein a peak near 1332 $cm^{-1}$ exists in the Raman spectrum.

* * * * *